(12) United States Patent
Tapily (10) Patent No.: US 12,494,362 B2
(45) Date of Patent: Dec. 9, 2025

(54) ATOMIC LAYER DEPOSITION OF ALUMINUM OXIDE FILMS FOR SEMICONDUCTOR DEVICES USING AN ALUMINUM ALKOXIDE OXIDIZER

(71) Applicant: Tokyo Electron Limited, Tokyo (JP)

(72) Inventor: Kandabara N. Tapily, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 751 days.

(21) Appl. No.: 17/698,876

(22) Filed: Mar. 18, 2022

(65) Prior Publication Data

US 2022/0310385 A1    Sep. 29, 2022

Related U.S. Application Data

(60) Provisional application No. 63/166,846, filed on Mar. 26, 2021.

(51) Int. Cl.
 *H01L 21/02* (2006.01)
(52) U.S. Cl.
 CPC .. *H01L 21/02178* (2013.01); *H01L 21/02205* (2013.01); *H01L 21/0228* (2013.01)
(58) Field of Classification Search
 None
 See application file for complete search history.

(56) References Cited

U.S. PATENT DOCUMENTS

| | | |
|---|---|---|
| 9,859,153 B1 | 1/2018 | Rainville et al. |
| 10,068,764 B2 | 9/2018 | Tapily et al. |
| 2001/0041250 A1 | 11/2001 | Werkhoven |
| 2005/0239297 A1 | 10/2005 | Senzaki et al. |
| 2005/0271817 A1 | 12/2005 | Kim |
| 2018/0076027 A1 | 3/2018 | Tapily et al. |
| 2019/0131130 A1 | 5/2019 | Smith et al. |

(Continued)

FOREIGN PATENT DOCUMENTS

| | | |
|---|---|---|
| JP | 2018046279 A | 3/2018 |
| JP | 2018085502 A | 5/2018 |

(Continued)

OTHER PUBLICATIONS

Ritala et al., "Atomic Layer Deposition of Oxide Thin Films with Metal Alkoxides as Oxygen Sources", Apr. 14, 2000, Science, vol. 288, pp. 319-321 (Year: 2000).*

(Continued)

*Primary Examiner* — Joshua L Allen
*Assistant Examiner* — Bradford M Gates (57) ABSTRACT

Method for gas phase atomic layer deposition (ALD) of aluminum oxide films on patterned substrates using a water-less oxidizer that includes an aluminum alkoxide gas. The method includes providing a substrate containing a dielectric layer and a metal layer or a semiconductor layer, and selectively depositing an aluminum oxide film on a surface (Continued)

of the dielectric layer relative to a surface of the metal layer or a surface of the semiconductor layer by a) exposing the substrate to an aluminum alkyl gas, an aluminum halide gas, or an aluminum hydride gas, and b) exposing the substrate to an aluminum alkoxide gas, where the aluminum alkoxide gas is the principal source of oxygen in the aluminum oxide film.

20 Claims, 10 Drawing Sheets

(56) References Cited

U.S. PATENT DOCUMENTS

| | | | |
|---|---|---|---|
| 2019/0316256 A1* | 10/2019 | Bhuyan | ............... C23C 16/04 |
| 2020/0090924 A1 | 3/2020 | Wu et al. | |
| 2020/0095674 A1 | 3/2020 | Saly et al. | |
| 2020/0227307 A1* | 7/2020 | LiCausi | ............ H01L 21/31111 |
| 2020/0251384 A1 | 8/2020 | Rainville et al. | |
| 2020/0325573 A1 | 10/2020 | Illiberi et al. | |
| 2022/0315612 A1 | 10/2022 | Li | |

FOREIGN PATENT DOCUMENTS

| | | |
|---|---|---|
| JP | 2020172704 A | 10/2020 |
| TW | 202100535 A | 1/2021 |
| WO | 2019199834 A1 | 10/2019 |

OTHER PUBLICATIONS

Korean Intellectual Property Office, International Search Report and Written Opinion for International application No. PCT/US2022/021013, mailed Jul. 7, 2022, 9pp.

Cho, Wontae, et al. "Atomic Layer Deposition of al2o3 Thin Films Using Dimethylaluminum Isopropoxide and Water." Journal of Vacuum Science & Technology A: Vacuum, Surfaces, and Films, vol. 21, No. 4, 2003, pp. 1366-1370., https://doi.org/10.1116/1.1562184.

Ritala, Mikko, et al. "Atomic Layer Deposition of Oxide Thin Films with Metal Alkoxides as Oxygen Sources." Science, vol. 288, No. 5464, 2000, pp. 319-321., https://doi.org/10.1126/science.288.5464.319.

Taiwanese Office Action mailed on May 8, 2025, issued in Taiwanese Patent Application No. TW111110735, with English Translation, total 24 pgs.

Office Action issued Aug. 5, 2025 in Japanese Patent Application No. 2023-558736, with English translation, 5 pages.

* cited by examiner

ATOMIC LAYER DEPOSITION OF ALUMINUM OXIDE FILMS FOR SEMICONDUCTOR DEVICES USING AN ALUMINUM ALKOXIDE OXIDIZER

CROSS REFERENCE TO RELATED APPLICATIONS

This application claims priority to and the benefit of the filing date of U.S. Provisional Patent Application No. 63/166,846, filed Mar. 26, 2021, which application is incorporated herein by reference in its entirety.

FIELD OF THE INVENTION

The present invention relates to semiconductor processing and semiconductor devices, and more particularly, to methods for aluminum oxide ($Al_2O_3$) film deposition using a waterless oxidizer.

BACKGROUND OF THE INVENTION

As device size is getting smaller, the complexity in semiconductor device manufacturing is increasing. The cost to produce the semiconductor devices is also increasing and cost effective solutions and innovations are needed. As smaller transistors are manufactured, the critical dimension (CD) or resolution of patterned features is becoming more challenging to produce. Selective deposition of thin films is a key patterning step in in highly scaled technology nodes. Water ($H_2O$), $O_2$ plasma or radicals, and ozone ($O_3$) are commonly used as oxidizers in ALD of oxide films, but these gases are strong oxidizers and can cause undesirable oxidation of substrate materials, which is becoming a significant issue with advanced device scaling. One example includes deposition of a high-permittivity (high-k) metal oxide film where a strong oxidizer oxidizes an underlying Si substrate and forms a thick low-k interfacial $SiO_2$ layer. New deposition methods are required that provide selective film deposition on different material surfaces while avoiding surface oxidation.

SUMMARY OF THE INVENTION

A method of atomic layer deposition of aluminum oxide films using a waterless oxidizer. According to one embodiment, the method includes providing a substrate containing a dielectric layer and a metal layer or a semiconductor layer, and selectively depositing an aluminum oxide film on a surface of the dielectric layer relative to a surface of the metal layer or a surface of the semiconductor layer by a) exposing the substrate to an aluminum alkyl gas, an aluminum halide gas, or an aluminum hydride gas, and b) exposing the substrate to an aluminum alkoxide gas, where the aluminum alkoxide gas is the principal source of oxygen in the aluminum oxide film.

According to another embodiment, the method includes providing a substrate containing a dielectric layer and a metal layer or a semiconductor layer, and selectively depositing an aluminum oxide film on a surface of the metal layer or on a surface of the semiconductor layer relative to a surface of the dielectric layer by a) exposing the substrate to a reactant gas containing a molecule that forms a self-assembled monolayer (SAM) on the surface of the dielectric layer, b) exposing the substrate to an aluminum alkyl gas, an aluminum halide gas, or an aluminum hydride gas, and c) exposing the substrate to an aluminum alkoxide gas, where the aluminum alkoxide gas is the principal source of oxygen in the aluminum oxide film.

According to another embodiment, the method includes providing a substrate containing raised features having a sidewall and a top portion, and a bottom area between the raised features, and selectively depositing an aluminum oxide film on the top portion and on an upper part of the sidewall of the raised features relative to the bottom area by a) exposing the substrate to an aluminum alkyl gas, an aluminum halide gas, or an aluminum hydride gas to form an adsorbed layer that is conformal over the raised features, and b) exposing the substrate to an aluminum alkoxide gas, where the alkoxide gas is the principal source of oxygen in the aluminum oxide film.

According to another embodiment, the method includes providing a substrate containing raised features having a sidewall and a top portion, and a bottom area between the raised features, and selectively depositing an aluminum oxide film on the sidewall and on the bottom area relative to the top portion by a) exposing the substrate to an aluminum alkyl gas, an aluminum halide gas, or an aluminum hydride gas to form an adsorbed layer that is conformal over the raised features, b) deactivating or removing the adsorbed layer on the top portion, and c) exposing the substrate to an aluminum alkoxide gas, where the aluminum alkoxide gas is the principal source of oxygen in the aluminum oxide film.

BRIEF DESCRIPTION OF THE DRAWINGS

A more complete appreciation of embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

Methods are described for gas phase atomic layer deposition (ALD) of aluminum oxide films on patterned substrates using a waterless oxidizer that includes an aluminum alkoxide gas.

Figure 1A:
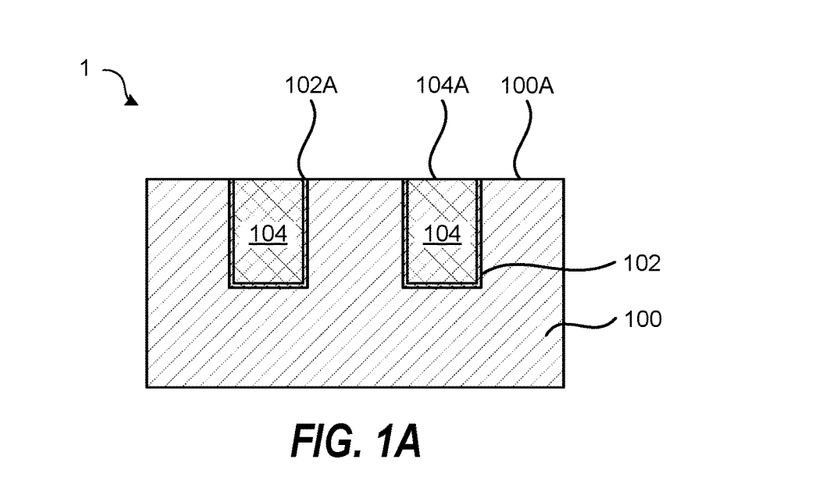
FIGS. 1A-1C show through schematic cross-sectional views a method of depositing an aluminum oxide film on a substrate according to an embodiment of the invention.
Figure 1B:
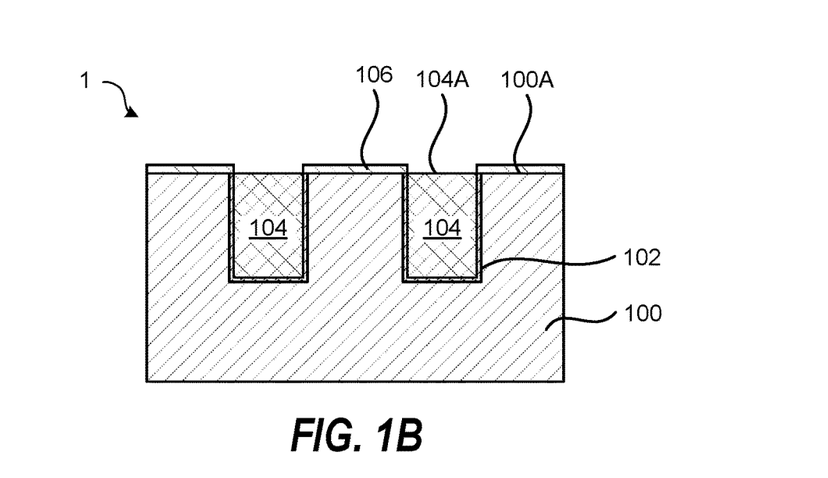
Figure 1C:
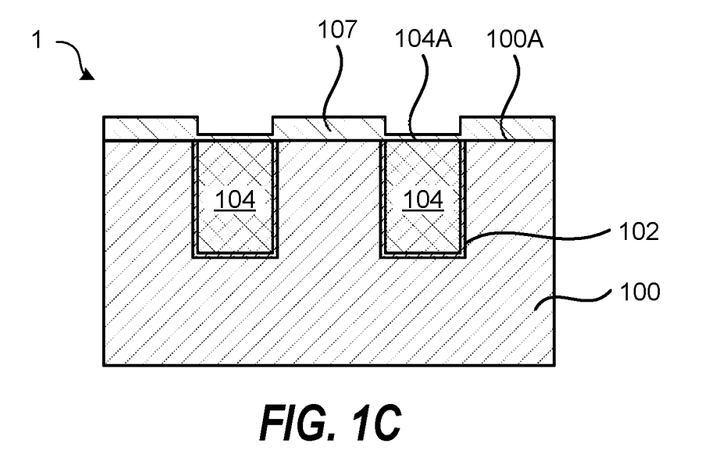

FIGS. 1A-1C show through schematic cross-sectional views a method of depositing an aluminum oxide film on a substrate according to an embodiment of the invention. In FIG. 1A, the substrate 1 contains a dielectric layer 100 having a surface 100A, a metal or semiconductor layer 104 having a surface 104A, and an optional diffusion barrier layer 102 having a surface 102A. The dielectric layer 100 can, for example, contain $SiO_2$ or a metal-containing dielectric layer. In other examples, the dielectric layer 100 can contain a low-k material, for example a SiCOH material. In one example, the metal-containing dielectric layer can contain a metal oxide, a metal nitride, or a metal oxynitride. In some examples, the metal or semiconductor layer 104 contains Cu, Al, Ta, Ti, W, Ru, Co, Ni, Mo, Si, Ge, or SiGe. Although not shown in FIG. 1A, the surface 104A of the metal or semiconductor layer 104 may be recessed a few nanometers below the surface 100A of the dielectric layer 100.

The method includes selectively depositing by ALD an aluminum oxide film 106 on the surface 100A of the dielectric layer 100 relative to the surface 104A of the metal or semiconductor layer 104. The ALD includes exposing the substrate to an aluminum alkyl gas, an aluminum halide gas, or an aluminum hydride gas to form an adsorbed layer containing aluminum (Al) on the surface 100A and, thereafter, exposing the substrate 1 to an aluminum alkoxide gas that reacts with the adsorbed layer to form the aluminum oxide film 106. The aluminum alkoxide gas is the principal source of oxygen in the deposited aluminum oxide film 106, where the reaction involves coordination of an oxygen atom of the alkoxy group of the aluminum alkoxide to the aluminum metal center of the adsorbed layer.

The selective deposition of the aluminum oxide film 106 on the surface 100A of the dielectric layer 100 relative to the surface 104A of the metal or semiconductor layer 104 is enabled by a longer incubation time for deposition on the surface 104A of the metal or semiconductor layer 104, where aluminum oxide film deposition is not desired, than on the surface 100A of the dielectric layer 100 where aluminum oxide film deposition is desired. The sequential and alternating gas exposures of the ALD process may be repeated at least once while maintaining the deposition selectivity to increase a thickness of the aluminum oxide film 106.

According to one embodiment, the alternating gas exposures may be further repeated after deposition selectivity is lost to also deposit aluminum oxide on the surface 104A of the metal or semiconductor layer 104. The resulting blanket aluminum oxide film 107 is depicted in FIG. 1C, where aluminum oxide is deposited on the entire substrate 1. The aluminum oxide film 107 may be thicker on the surface 100A than on the surface 104A due to the longer incubation time for aluminum oxide deposition on the surface 104A.

For example, the aluminum alkyl gas can contain trimethyl aluminum ($Al(CH_3)_3$), triethyl aluminum ($Al(CH_2CH_3)_3$), tripropyl aluminum ($Al(CH_2CH_2CH_3)_3$), or triisobutylaluminum ($Al(CH_2CH(CH_3)_2)_3$). For example, the aluminum halide can contain $AlCl_3$, $AlF_3$, $AlBr_3$, or $AlI_3$. For example, the aluminum hydride can contain $AlH_3$.

For example, the aluminum alkoxide can contain aluminum isopropoxide ($Al(OCH(CH_3)_2)_3$), aluminum trimethoxide ($Al(OCH_3)_3$), aluminum triethoxide ($Al(OCH_2CH_3)_3$) and a dialkylaluminum alkoxide. The dialkylaluminum alkoxide can, for example, include dimethylaluminum isopropoxide (($CH_3)_2AlOCH(CH_3)_2$), dimethylaluminum tertbutoxide (($CH_3)_2AlOC(CH_3)_3$), diethylaluminum isopropoxide (($CH_3CH_2)_2AlOCH(CH_3)_2$), dimethylaluminum secbutoxide (($CH_3)_2AlOCHCH_3(CH_2CH_3)$), or diethylaluminum ethoxide (($CH_3CH_2)_2AlOCH_2CH_3$).

Figure 2A:
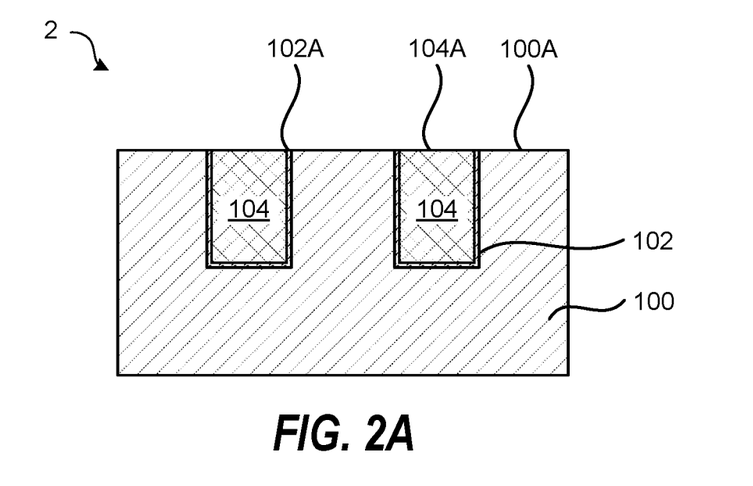
FIGS. 2A-2D show through schematic cross-sectional views a method of depositing an aluminum oxide film on a substrate according to an embodiment of the invention.
Figure 2B:
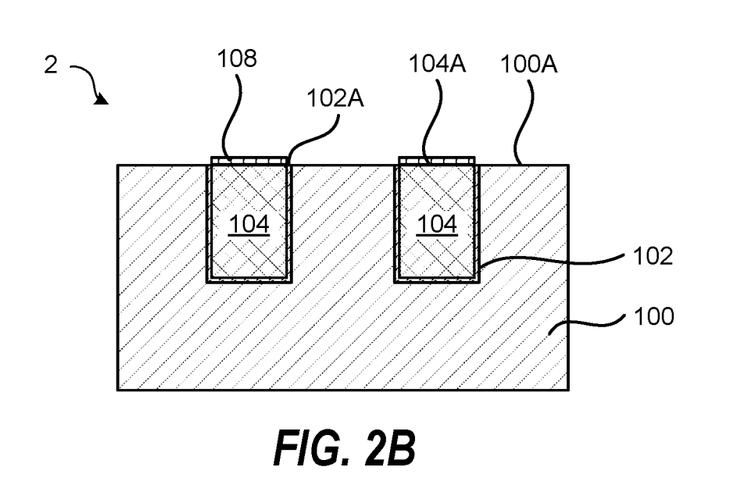

FIGS. 2A-2D show through schematic cross-sectional views a method of depositing an aluminum oxide film on a substrate according to an embodiment of the invention. The substrate 1 from FIG. 1A has been reproduced as substrate 2 in FIG. 2A. The method includes exposing the substrate 2 to a reactant gas containing a molecule that selectively forms a self-assembled monolayer (SAM) 108 on the surface 104A of the metal or semiconductor layer 104. This is schematically shown in FIG. 2B.

SAMs are molecular assemblies that are spontaneously formed on substrate surfaces by adsorption and are organized into more or less large ordered domains. The SAMs can include a molecule that possesses a head group, a tail group, and a functional end group, and SAMs are created by the chemisorption of head groups onto the substrate from the vapor phase at room temperature or above room temperature, followed by a slow organization of the tail groups. Initially, at small molecular density on the surface, adsorbate molecules form either a disordered mass of molecules or form an ordered two-dimensional "lying down phase", and at higher molecular coverage, over a period of minutes to hours, begin to form three-dimensional crystalline or semicrystalline structures on the substrate surface. The head groups assemble together on the substrate, while the tail groups assemble far from the substrate. According to one embodiment, the head group of the molecule forming the SAM 108 can include a thiol, a phosphonate, silane, or a carboxylate. For example, the thiol can include 1-octadecylthiol ($CH_3(CH_2)_{17}SH$), 1-dodecylthiol ($CH_3(CH_2)_{17}SH$), or perfluorodecanethiol ($CF_3(CF_2)_7CH_2CH_2SH$).

Figure 2C:
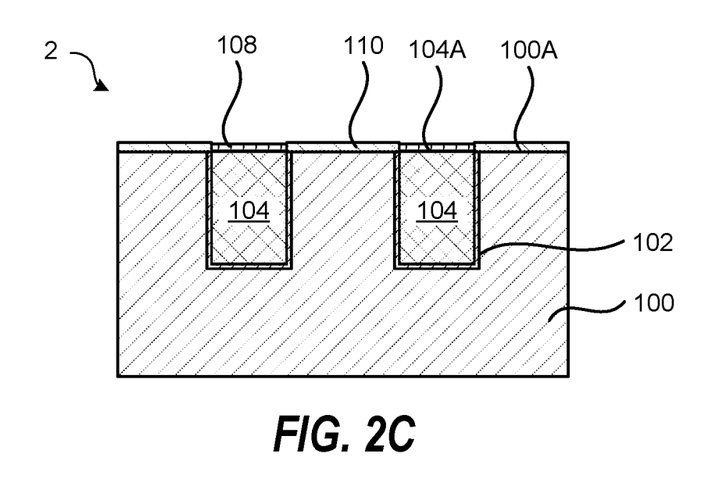

The method further includes selectively depositing an aluminum oxide film 110 by ALD on the surface 100A of the dielectric layer 100 relative to the SAM 108, where the SAM 108 acts as a deposition blocking layer. This is schematically shown in FIG. 2C. The ALD includes exposing the substrate to an aluminum alkyl gas, an aluminum halide gas, or an aluminum hydride gas to form an adsorbed layer containing aluminum on the surface 100A and, thereafter, exposing the substrate to an aluminum alkoxide gas that reacts with the adsorbed layer to form the aluminum oxide film 110. The aluminum alkoxide gas is the principal source of oxygen in the deposited aluminum oxide film 110, where the reaction involves coordination of an oxygen atom of the alkoxy group to the aluminum metal center of the adsorbed layer.

The selective deposition of the aluminum oxide film 110 on the surface 100A of the dielectric layer 100 relative to the surface 104A of the metal or semiconductor layer 104 containing the SAM 108 is enabled by an increased incubation time for deposition on the SAM 108, or on defects in the SAM 108, compared to the clean surface 104A of the metal or semiconductor layer 104. The alternating gas exposures may be repeated at least once while maintaining the deposition selectivity to increase a thickness of the aluminum oxide film 110.

Figure 2D:
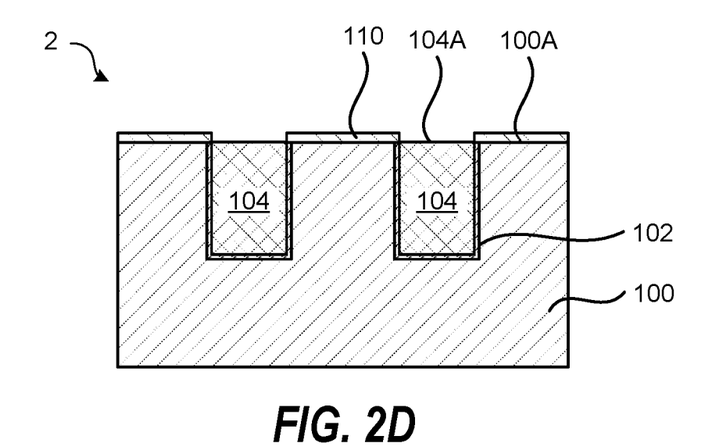

Thereafter, the SAM 108 may be removed to produce the substrate depicted in FIG. 2D, where the aluminum oxide film 110 is selectively formed on the surface 100A. In one example, the SAM 108 may be removed by heating. According to other embodiments, other types of blocking layers than a SAM may be used, for example anilines, acetylacetone, and acetylacetone-based chemicals.

Figure 3A:
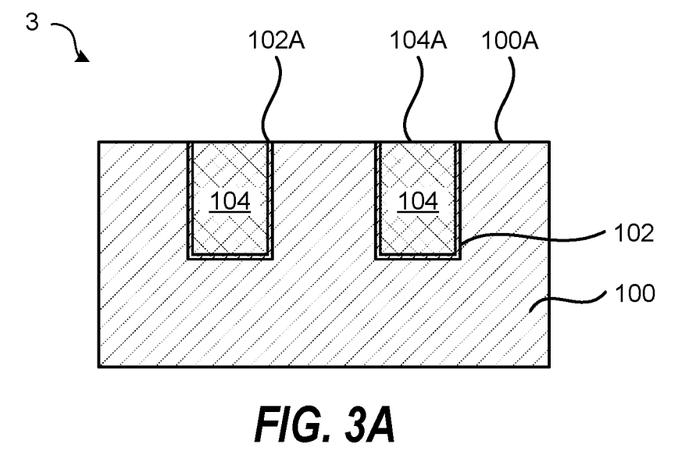
FIGS. 3A-3D show through schematic cross-sectional views a method of depositing an aluminum oxide film on a substrate according to an embodiment of the invention.
Figure 3B:
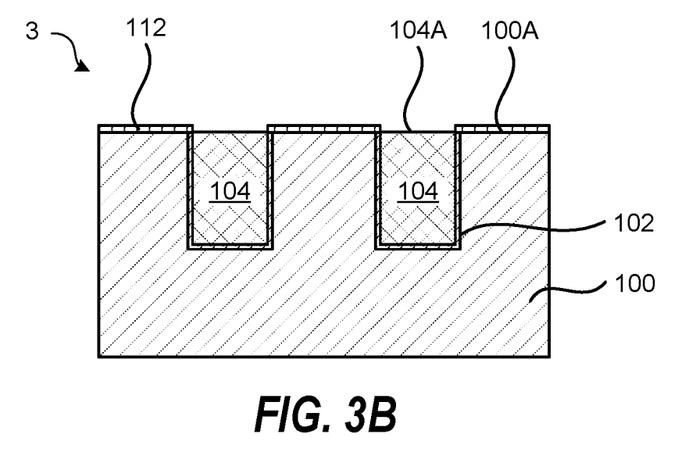

FIGS. 3A-3D show through schematic cross-sectional views a method of depositing an aluminum oxide film on a substrate according to an embodiment of the invention. The substrate 1 from FIG. 1A has been reproduces as substrate 3 in FIG. 3A. The method includes exposing the substrate 3 to a reactant gas containing a molecule that selectively forms a self-assembled monolayer (SAM) 112 on the surface 100A of the dielectric layer 100. This is schematically shown in FIG. 3B.

According to one embodiment, the head group of the molecule forming the SAM 112 can include a silane. Examples of silanes include molecules that contain C, H, Cl, F, and Si atoms, or C, H, Cl, and Si atoms. Non-limiting examples of the molecule include perfluorodecyltrichlorosilane ($CF_3(CF_2)_7CH_2CH_2SiCl_3$), chlorodecyldimethylsilane ($CH_3(CH_2)_8CH_2Si(CH_3)_2Cl$), and tertbutyl(chloro)dimethylsilane (($CH_3)_3CSi(CH_3)_2Cl$)).

Figure 3C:
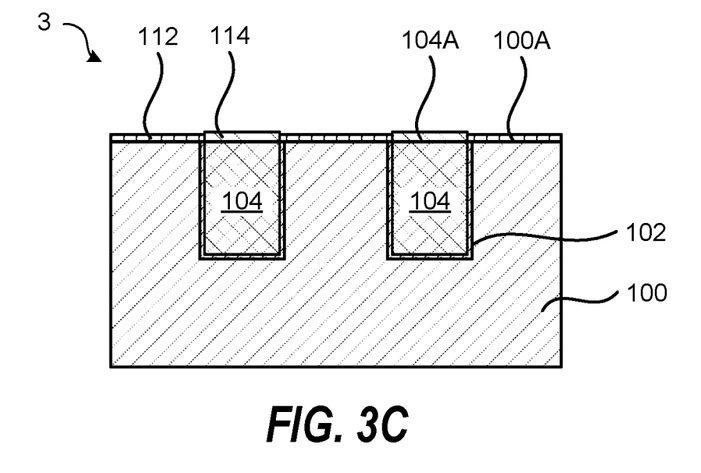

The method further includes selectively depositing an aluminum oxide film 114 by ALD on the surface 104A of the metal or semiconductor layer 104 relative to the SAM 112. This is schematically shown in FIG. 3C. The ALD includes exposing the substrate to an aluminum alkyl gas, an aluminum halide gas, or an aluminum hydride gas to form an adsorbed layer containing aluminum on the surface 140A, and thereafter, exposing the substrate to an aluminum alkoxide gas, wherein the aluminum alkoxide gas is the principal source of oxygen in the deposited aluminum oxide film 114.

The selective deposition of the aluminum oxide film 114 on the surface 104A of the metal or semiconductor layer 104 relative to the surface 100A of the dielectric layer 100 is enabled by blocking deposition on the SAM 112. The alternating gas exposures may be repeated at least once while maintaining the deposition selectivity to increase a thickness of the aluminum oxide film 114.

Figure 3D:
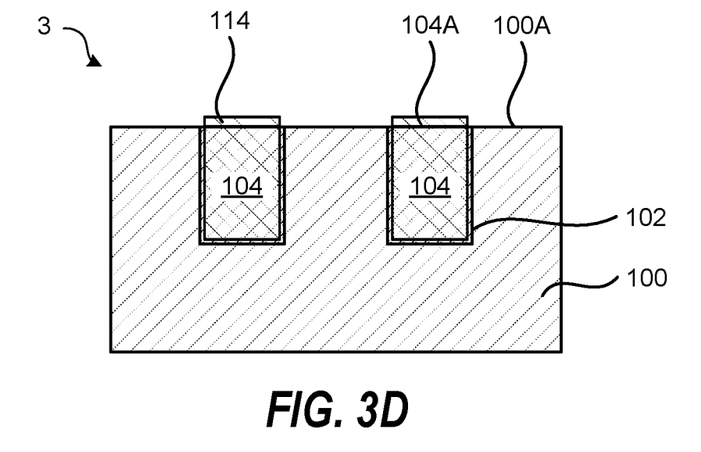

Thereafter, the SAM 112 may be removed to produce the substrate 3 depicted in FIG. 3D, where the aluminum oxide film 114 is selectively formed on the surface 104A. According to other embodiments, other types of blocking layers than a SAM may be used, for example anilines, acetylacetone, and acetylacetone-based chemicals.

Figure 4A:
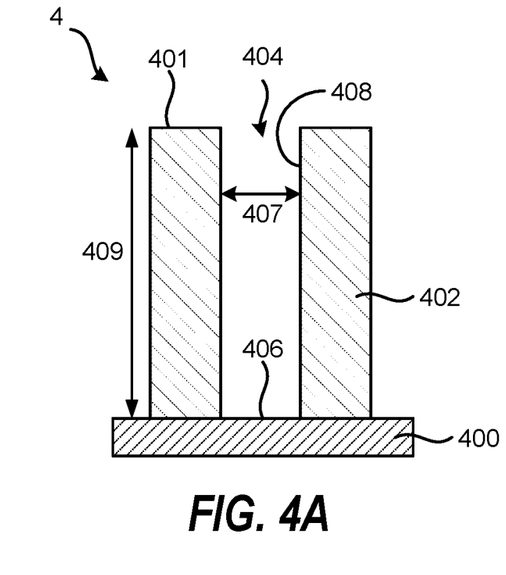
FIGS. 4A-4F show through schematic cross-sectional views a method of depositing an aluminum oxide film on a substrate according to an embodiment of the invention.
Figure 4B:
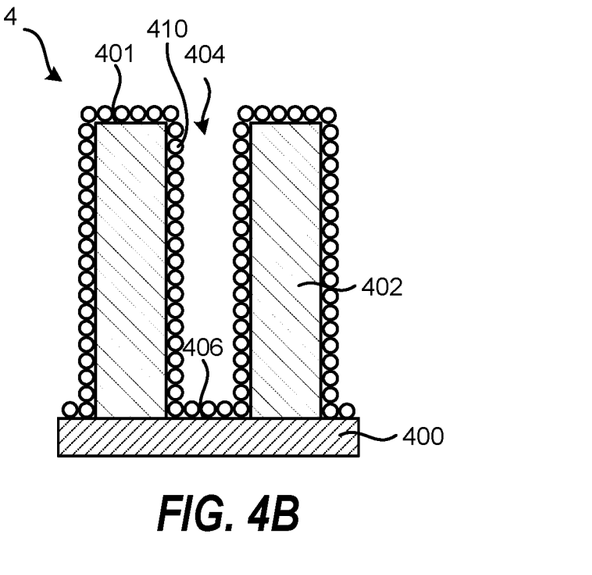

FIGS. 4A-4F show through schematic cross-sectional views a method of depositing an aluminum oxide film on a substrate according to an embodiment of the invention. As schematically shown in FIG. 4A, the method includes providing a substrate 4 containing a first film 402 and a second film 400. The first film 402 contains raised features with a top portion 401 and a recessed feature 404 having a sidewall 408 and a bottom area 406. The recessed feature 404 can, for example, have a width 407 that is less than 200 nm, less than 100 nm, less than 50 nm, less than 25 nm, less than 20 nm, or less than 10 nm. In other examples, the recessed feature 404 can have a width 407 that is between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm. The recessed feature 404 can, for example, have a depth 409 of 25 nm, 50 nm, 100 nm, 200 nm, or greater.

In some examples, the first film 402 and the second film 400 may contain or consist of the same material. In one example, the first film 402 and the second film 400 may contain or consist of Si. In some examples, the first film 402 may contain a dielectric layer, for example $SiO_2$, SiON, SiN, a high-k material, a low-k material, or an ultra-low-k material. The recessed feature 404 may be formed using well-known lithography and etching processes.

The method further includes depositing an aluminum oxide film on the raised features, where the aluminum oxide film is non-conformally deposited with a greater film thickness on the top portion 401 than on the sidewall 408 and the bottom area 406. The aluminum oxide film is deposited by exposing the substrate 4 to an aluminum alkyl gas, an aluminum halide gas, or an aluminum hydride gas that forms an adsorbed layer 410 that is conformal on the raised features. The exposure conditions may be selected such that a saturation exposure is reached where the aluminum alkyl gas, the aluminum halide gas, or the aluminum hydride gas reaches the bottom area 406 of the recessed feature 404 and forms the adsorbed layer 410, schematically shown as open circles 410 in FIG. 4B.

Figure 4C:
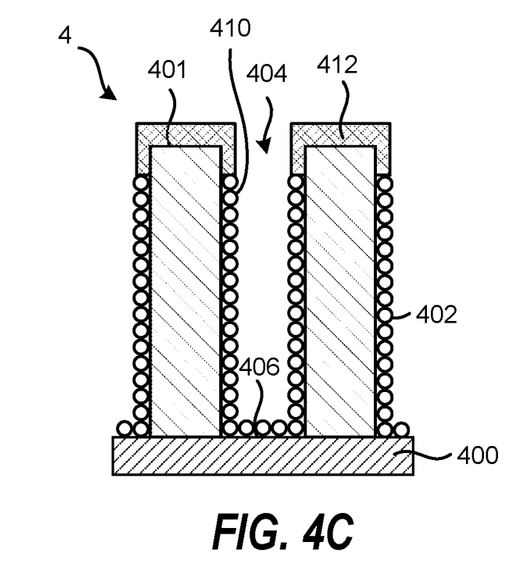

Thereafter, the method further includes exposing the substrate 4 to an aluminum alkoxide gas, where the exposure conditions are selected such that saturation exposure is not reached in the recessed feature 404 and the aluminum alkoxide gas does not reach the bottom area 406 between the raised features and is only exposed to the adsorbed layer 410 on the top portion 401 and on an upper portion of the sidewall 408, where the aluminum alkoxide gas reacts with the adsorbed layer 410 to form an aluminum oxide film 412. This is schematically shown in FIG. 4C. Processing conditions such as substrate temperature, gas pressure, gas composition, and substrate rotation during the gas exposure may be selected to achieve the non-saturation exposure in the recessed feature 404.

Figure 4D:
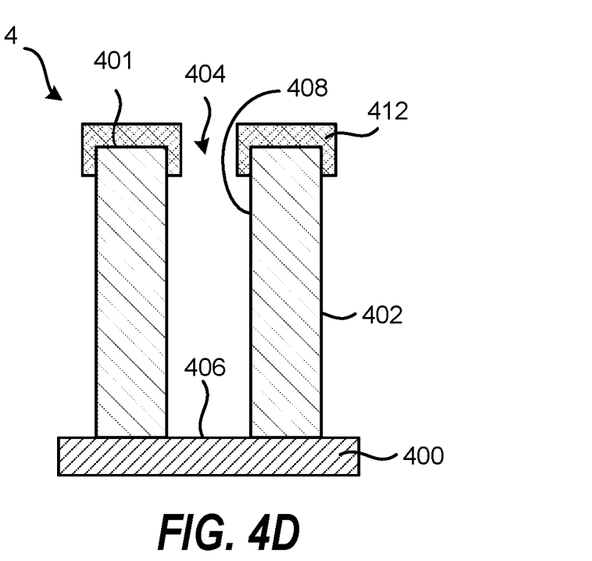
Figure 4E:
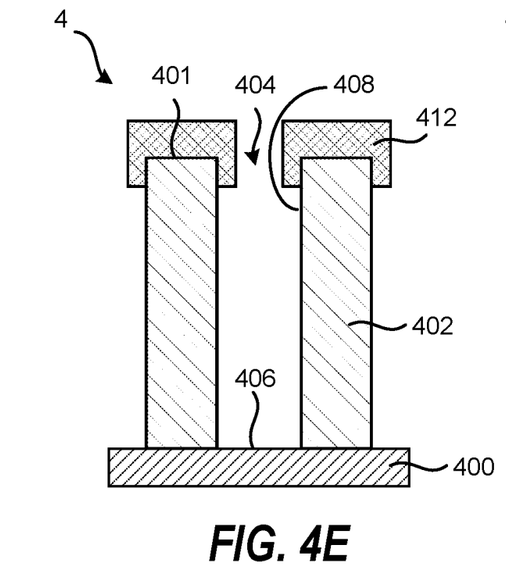
Figure 4F:
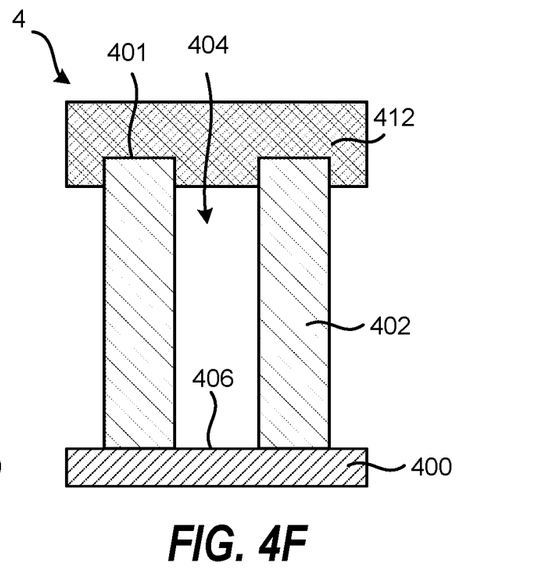

Thereafter, any unreacted portion of the adsorbed layer 410 in the recessed feature 404 may be removed, for example by heating. The resulting substrate 4 is schematically shown in FIG. 4D. The alternating steps of exposing the substrate 4 to the aluminum alkyl gas, the aluminum halide gas, or the aluminum hydride gas, and thereafter the aluminum alkoxide gas, may be repeated at least once to increase a thickness of the aluminum oxide film 412 on the top portion 401 and on the upper portion of the sidewall 408. This is schematically shown in FIG. 4E. Further, as shown in FIG. 4F, after repeating the exposing steps at least once, the resulting aluminum oxide film 412 may pinch off the opening of the recessed feature 404 and form a closed airgap in the recessed feature 404 below the aluminum oxide film 412.

Figure 5A:
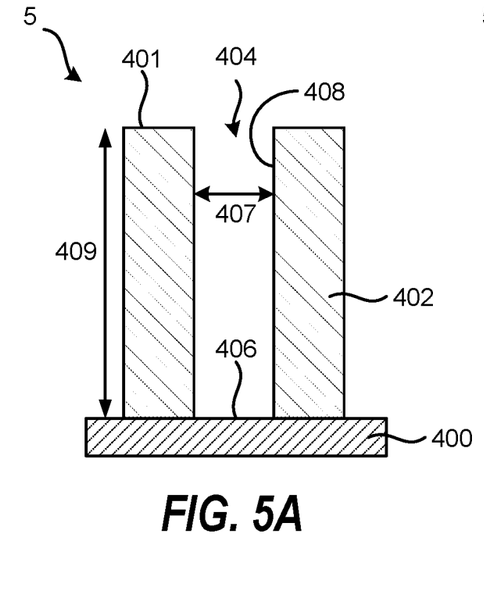
FIGS. 5A-5F show through schematic cross-sectional views a method of depositing an aluminum oxide film on a substrate according to an embodiment of the invention.
Figure 5B:
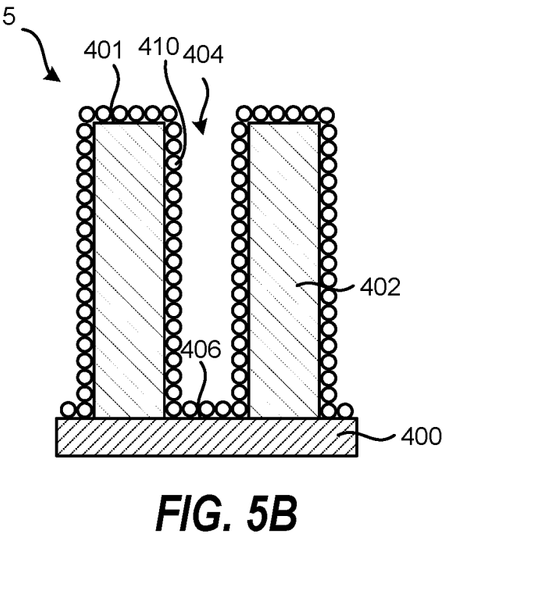
Figure 5C:
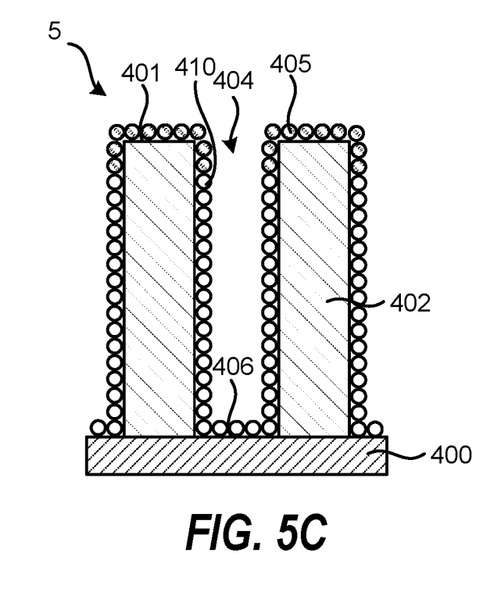

FIGS. 5A-5F show through schematic cross-sectional views a method of depositing an aluminum oxide film on a substrate according to an embodiment of the invention. The substrate 4 from FIGS. 4A and 4B has been reproduced as substrate 5 in FIGS. 5A and 5B, respectively. The substrate 5 contains an adsorbed layer 410 that is conformal on the raised features following an exposure of the substrate 5 to an aluminum alkyl gas, an aluminum halide gas, or an aluminum hydride gas. The method includes exposing the substrate 5 in FIG. 5B to a halogen-containing gas or an oxygen-containing gas to deactivate or remove the adsorbed layer 410 from the top portion 401 and from an upper portion of the sidewall 408. The exposure to the halogen-containing gas or the oxygen-containing gas does not reach a lower portion of the sidewall 408 or the bottom area 406. FIG. 5C schematically show the formation of a deactivated layer 405, indicated by hatched circles, from the gas exposure. The gas exposure may be performed in the absence of a plasma or in the presence of plasma excitation. Processing conditions such as substrate temperature, gas pressure, gas composition, and substrate rotation during the gas exposure may be selected to control the deactivation of the adsorbed layer 410. In some examples, a highly diluted halogen-containing gas and high total gas pressure (e.g., greater than about 1 Torr) may be utilized to provide a highly isotropic exposure of the halogen-containing gas.

Non-limiting examples of the halogen-containing gas include $Cl_2$, $BCl_3$, $CCl_4$, HCl, HBr, $TiCl_4$, and a combination thereof. Non-limiting examples of the oxygen-containing gas include $O_3$, $O_2$, $H_2O$, $H_2O_2$, and a combination thereof. The halogen-containing gas and the oxygen-containing gas can further include an inert gas such as Argon (Ar).

Figure 5D:
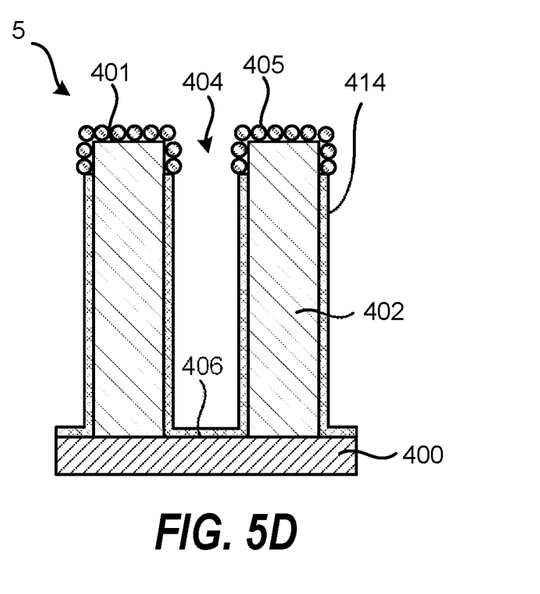

Thereafter, the method further includes exposing the substrate 5 to an aluminum alkoxide gas that forms an aluminum oxide film 414 by reacting with the adsorbed layer 410 on the sidewall 408 below the deactivated layer 405 and on the bottom area 406, but the aluminum oxide film 412 is not formed on the deactivated layer 405. This is schematically shown in FIG. 5D. The exposure conditions may be selected such that a saturation exposure is reached where the aluminum alkoxide gas reaches the lower portion of the sidewall 408 and the bottom area 406 of the recessed feature 410.

Figure 5E:
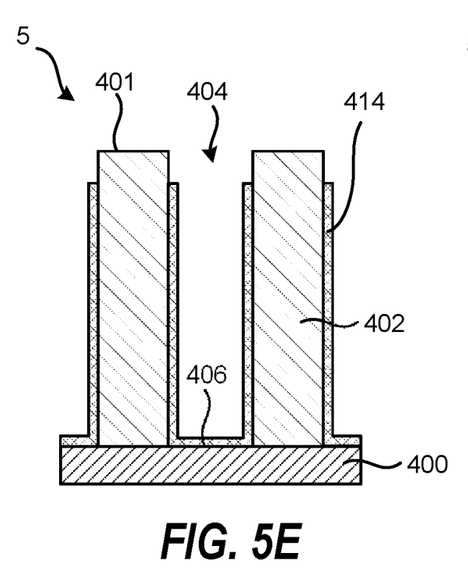
Figure 5F:
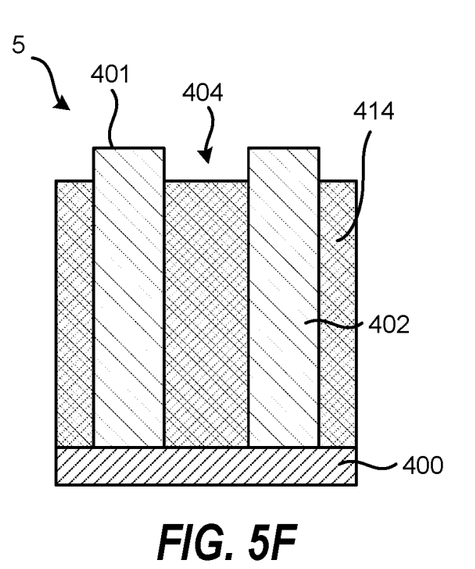

Thereafter, the deactivated layer 405 may be removed, for example by heating. This is schematically shown in FIG. 5E. The alternating exposure steps may be repeated at least once to increase the thickness of the aluminum oxide film 412 in the recessed feature 404. In the example schematically shown in FIG. 5F, the recessed feature 410 is substantially fully filled with the aluminum oxide film 414 after repeating the alternating exposure steps at least once.

Methods for aluminum oxide film deposition using a waterless oxidizer have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
    providing a substrate containing a dielectric layer and a metal layer or a semiconductor layer; and
    selectively depositing an aluminum oxide film on a surface of the dielectric layer relative to a surface of the metal layer or a surface of the semiconductor layer by:
    a) exposing the substrate to an aluminum alkyl gas, an aluminum halide gas, or an aluminum hydride gas,
    b) exposing the substrate to an aluminum alkoxide gas, wherein the aluminum alkoxide gas is the principal source of oxygen in the aluminum oxide film, and
    c) repeating steps a) and b) at least once to increase a thickness of the aluminum oxide film on the surface of the dielectric layer, wherein c) results in loss of deposition selectivity and forms a blanket aluminum oxide film on the surface of the dielectric layer and on the surface of the metal layer or on the surface of the semiconductor layer.

2. The method of claim 1, further comprising:
    prior to selectively depositing the aluminum oxide film, exposing the substrate to a reactant gas containing a molecule that forms a self-assembled monolayer (SAM) on the surface of the metal layer or on the surface of the semiconductor layer.

3. The method of claim 2, wherein the molecule includes a head group, a tail group, and a functional end group, and wherein the head group includes a thiol, a silane, a phosphonate, or a carboxylate.

4. The method of claim 1, wherein the aluminum alkyl gas contains trimethyl aluminum (Al(CH$_3$)$_3$), triethyl aluminum (Al(CH$_2$CH$_3$)$_3$), tripropyl aluminum (Al(CH$_2$CH$_2$CH$_3$)$_3$), or triisobutylaluminum (Al(CH$_2$CH(CH$_3$)$_2$)$_3$), the aluminum halide gas contains AlCl$_3$, AlF$_3$, AlBr$_3$, or AlI$_3$, the aluminum hydride gas contains AlH$_3$, and the aluminum alkoxide gas contains aluminum isopropoxide (Al(OCH(CH$_3$)$_2$)$_3$), aluminum trimethoxide (Al(OCH$_3$)$_3$), dimethylaluminum isopropoxide ((CH$_3$)$_2$AlOCH(CH$_3$)$_2$), dimethylaluminum tertbutoxide ((CH$_3$)$_2$AlOC(CH$_3$)$_3$), diethylaluminum isopropoxide ((CH$_3$CH$_2$)$_2$AlOCH(CH$_3$)$_2$), dimethylaluminum secbutoxide ((CH$_3$)$_2$AlOCHCH$_3$(CH$_2$CH$_3$)), aluminum triethoxide (Al(OCH$_2$CH$_3$)$_3$), or diethylaluminum ethoxide ((CH$_3$CH$_2$)$_2$AlOCH$_2$CH$_3$).

5. A substrate processing method, comprising:
    providing a substrate containing raised features having a sidewall and a top portion, and a bottom area between the raised features; and
    selectively depositing an aluminum oxide film on the top portion and on an upper part of the sidewall of the raised features relative to the bottom area by:
    a) exposing the substrate to an aluminum alkyl gas, an aluminum halide gas, or an aluminum hydride gas to form an adsorbed layer that is conformal on the raised features, and
    b) exposing the substrate to an aluminum alkoxide gas, wherein the alkoxide gas is the principal source of oxygen in the aluminum oxide film, wherein during step b), the aluminum alkoxide gas does not reach the bottom area between the raised features.

6. The method of claim 5, further comprising:
    c) repeating steps a) and b) at least once to increase a thickness of the aluminum oxide film.

7. The method of claim 6, wherein the aluminum oxide film pinches off an opening between the raised features and forms an airgap.

8. The method of claim 5, wherein the aluminum alkyl gas contains trimethyl aluminum (Al(CH$_3$)$_3$), triethyl aluminum (Al(CH$_2$CH$_3$)$_3$), tripropyl aluminum (Al(CH$_2$CH$_2$CH$_3$)$_3$), or triisobutylaluminum (Al(CH$_2$CH(CH$_3$)$_2$)$_3$), the aluminum halide gas contains AlCl$_3$, AlF$_3$, AlBr$_3$, or AlI$_3$, the aluminum hydride gas contains AlH$_3$, and the aluminum alkoxide gas contains aluminum isopropoxide (Al(OCH(CH$_3$)$_2$)$_3$), aluminum trimethoxide (Al(OCH$_3$)$_3$), dimethylaluminum isopropoxide ((CH$_3$)$_2$AlOCH(CH$_3$)$_2$), dimethylaluminum tertbutoxide ((CH$_3$)$_2$AlOC(CH$_3$)$_3$), diethylaluminum isopropoxide ((CH$_3$CH$_2$)$_2$AlOCH(CH$_3$)$_2$), dimethylaluminum secbutoxide ((CH$_3$)$_2$AlOCHCH$_3$(CH$_2$CH$_3$)), aluminum triethoxide (Al(OCH$_2$CH$_3$)$_3$), or diethylaluminum ethoxide ((CH$_3$CH$_2$)$_2$AlOCH$_2$CH$_3$).

9. A substrate processing method, comprising:
    providing a substrate containing raised features having a sidewall and a top portion, and a bottom area between the raised features; and
    selectively depositing an aluminum oxide film on the sidewall and on the bottom area relative to the top portion by:
    a) exposing the substrate to an aluminum alkyl gas, an aluminum halide gas, or an aluminum hydride gas to form an adsorbed layer containing aluminum that is conformal on the raised features,
    b) deactivating or removing the adsorbed layer containing aluminum on the top portion, and
    c) exposing the substrate to an aluminum alkoxide gas, wherein the aluminum alkoxide gas is the principal source of oxygen in the aluminum oxide film, wherein c) is performed after b).

10. The method of claim 9, further comprising:
    d) repeating steps a), b), and c) at least once to increase a thickness of the aluminum oxide film.

11. The method of claim 9, wherein the aluminum oxide film at least substantially fully fills a recessed feature between the raised features.

12. The method of claim 9, wherein the deactivating or removing the adsorbed layer includes exposing the substrate to a halogen-containing gas or an oxygen-containing gas.

13. The method of claim 12, wherein the halogen-containing gas contains $Cl_2$, $BCl_3$, $CCl_4$, HCl, HBr, $TiCl_4$, or a combination thereof, and the oxygen-containing gas contains $O_3$, $O_2$, $H_2O$, $H_2O_2$, or a combination thereof.

14. The method of claim 9, wherein the aluminum alkyl gas contains trimethyl aluminum ($Al(CH_3)_3$), triethyl aluminum ($Al(CH_2CH_3)_3$), tripropyl aluminum ($Al(CH_2CH_2CH_3)_3$), or triisobutylaluminum ($Al(CH_2CH(CH_3)_2)_3$), the aluminum halide gas contains $AlCl_3$, $AlF_3$, $AlBr_3$, or $AlI_3$, the aluminum hydride gas contains $AlH_3$, and the aluminum alkoxide gas contains aluminum isopropoxide ($Al(OCH(CH_3)_2)_3$), aluminum trimethoxide ($Al(OCH_3)_3$), dimethylaluminum isopropoxide ($(CH_3)_2AlOCH(CH_3)_2$), dimethylaluminum tertbutoxide ($(CH_3)_2AlOC(CH_3)_3$), diethylaluminum isopropoxide ($(CH_3CH_2)_2AlOCH(CH_3)_2$), dimethylaluminum secbutoxide ($(CH_3)_2AlOCHCH_3(CH_2CH_3)$), aluminum triethoxide ($Al(OCH_2CH_3)_3$), or diethylaluminum ethoxide ($(CH_3CH_2)_2AlOCH_2CH_3$).

15. A substrate processing method, comprising:
providing a substrate containing raised features having a sidewall and a top portion, and a bottom area between the raised features; and
selectively depositing an aluminum oxide film on the sidewall and on the bottom area relative to the top portion by:
a) exposing the substrate to an aluminum alkyl gas, an aluminum halide gas, or an aluminum hydride gas to form an adsorbed layer containing aluminum that is conformal on the raised features,
b) deactivating or removing the adsorbed layer containing aluminum on the top portion, and
c) exposing the substrate to an aluminum alkoxide gas that reacts with the adsorbed layer containing aluminum that remains on the substrate following step b) to form the aluminum oxide film, wherein the aluminum alkoxide gas is the principal source of oxygen in the aluminum oxide film.

16. The method of claim 15, further comprising:
repeating steps a), b), and c) at least once to increase a thickness of the aluminum oxide film.

17. The method of claim 15, wherein the aluminum oxide film at least substantially fully fills a recessed feature between the raised features.

18. The method of claim 15, wherein the deactivating or removing the adsorbed layer includes exposing the substrate to a halogen-containing gas or an oxygen-containing gas.

19. The method of claim 18, wherein the halogen-containing gas contains $Cl_2$, $BCl_3$, $CCl_4$, HCl, HBr, $TiCl_4$, or a combination thereof, and the oxygen-containing gas contains $O_3$, $O_2$, $H_2O$, $H_2O_2$, or a combination thereof.

20. The method of claim 15, wherein the aluminum alkyl gas contains trimethyl aluminum ($Al(CH_3)_3$), triethyl aluminum ($Al(CH_2CH_3)_3$), tripropyl aluminum ($Al(CH_2CH_2CH_3)_3$), or triisobutylaluminum ($Al(CH_2CH(CH_3)_2)_3$), the aluminum halide gas contains $AlCl_3$, $AlF_3$, $AlBr_3$, or $AlI_3$, the aluminum hydride gas contains $AlH_3$, and the aluminum alkoxide gas contains aluminum isopropoxide ($Al(OCH(CH_3)_2)_3$), aluminum trimethoxide ($Al(OCH_3)_3$), dimethylaluminum isopropoxide ($(CH_3)_2AlOCH(CH_3)_2$), dimethylaluminum tertbutoxide ($(CH_3)_2AlOC(CH_3)_3$), diethylaluminum isopropoxide ($(CH_3CH_2)_2AlOCH(CH_3)_2$), dimethylaluminum secbutoxide ($(CH_3)_2AlOCHCH_3(CH_2CH_3)$), aluminum triethoxide ($Al(OCH_2CH_3)_3$), or diethylaluminum ethoxide ($(CH_3CH_2)_2AlOCH_2CH_3)_2$).

\* \* \* \* \*